United States Patent [19]

Jalby et al.

[11] Patent Number: 5,230,847
[45] Date of Patent: Jul. 27, 1993

[54] METHOD OF FORMING REFRACTORY METAL FREE STANDING SHAPES

[75] Inventors: Pierre Jalby, La Marne; Pierre Claverie, Boulogne; Frédéric Rotman, Paris, all of France; Masao Kimura, Minato, Japan; Jean-Marie Friedt, Funakawara, Japan; Juichi Arai, Ibaraki Pref., Japan

[73] Assignee: L'Air Liquide, Societe Anonyme l'Etude et l'Exploitation des Procedes Georges Claude, Paris Cedex, France

[21] Appl. No.: 718,984

[22] Filed: Jun. 21, 1991

[30] Foreign Application Priority Data

Jun. 26, 1990 [EP] European Pat. Off. ........ 90401820.7

[51] Int. Cl.$^5$ ............................................. B29C 41/50
[52] U.S. Cl. ................................. 264/81; 29/527.2; 164/46; 264/82; 264/129; 427/250; 427/253
[58] Field of Search ................. 264/129, 81, 82; 29/423, 527.2; 204/298.13; 118/715, 728; 164/46; 427/248.1, 250, 253

[56] References Cited

U.S. PATENT DOCUMENTS

| | | | |
|---|---|---|---|
| 3,072,983 | 1/1963 | Brenner et al. | 164/46 |
| 4,202,080 | 5/1980 | Holzl et al. | 29/423 X |
| 4,756,927 | 7/1988 | Black et al. | 427/253 X |
| 4,830,891 | 5/1989 | Nishitani et al. | 427/253 |
| 4,849,260 | 7/1989 | Kusumoto et al. | 427/253 X |
| 4,851,295 | 7/1989 | Brors | 427/255.2 X |
| 5,055,246 | 10/1991 | Jalby et al. | 264/81 |

FOREIGN PATENT DOCUMENTS 0247783 12/1987 European Pat. Off. .

OTHER PUBLICATIONS

Patent Abstracts of Japan, vol. 13, No. 111 (C-577)[3459], Mar. 16, 1989, & JP-A-63-286574, Nov. 24, 1988, "Vapor Deposition Method of Tungsten by CVD Method".
Chemical Abstracts, vol. 104, No. 2, Jan. 1986, p. 238, Abstract No. 104:9492k, & JP-A-60 145 376, Jul. 31, 1985, Y. Shiotani, et al., "Formation of Tungsten Silicide Films".

Primary Examiner—Richard L. Chiesa
Attorney, Agent, or Firm—Oblon, Spivak, McClelland, Maier & Neustadt

[57] ABSTRACT

The present invention provides a method of forming a free standing shape made of a material containing refractory metal, which entails providing a mandrel in a CVD enclosure, injecting a refractory halide gas and a reducing gas in the enclosure, reacting the gases in the enclosure to generate a material containing refractory metal, growing a layer of the material containing refractory metal on the mandrel and removing the mandrel to obtain the free standing shape, wherein the reducing gases is a silicon hydride gas or a mixture thereof.

15 Claims, 3 Drawing Sheets

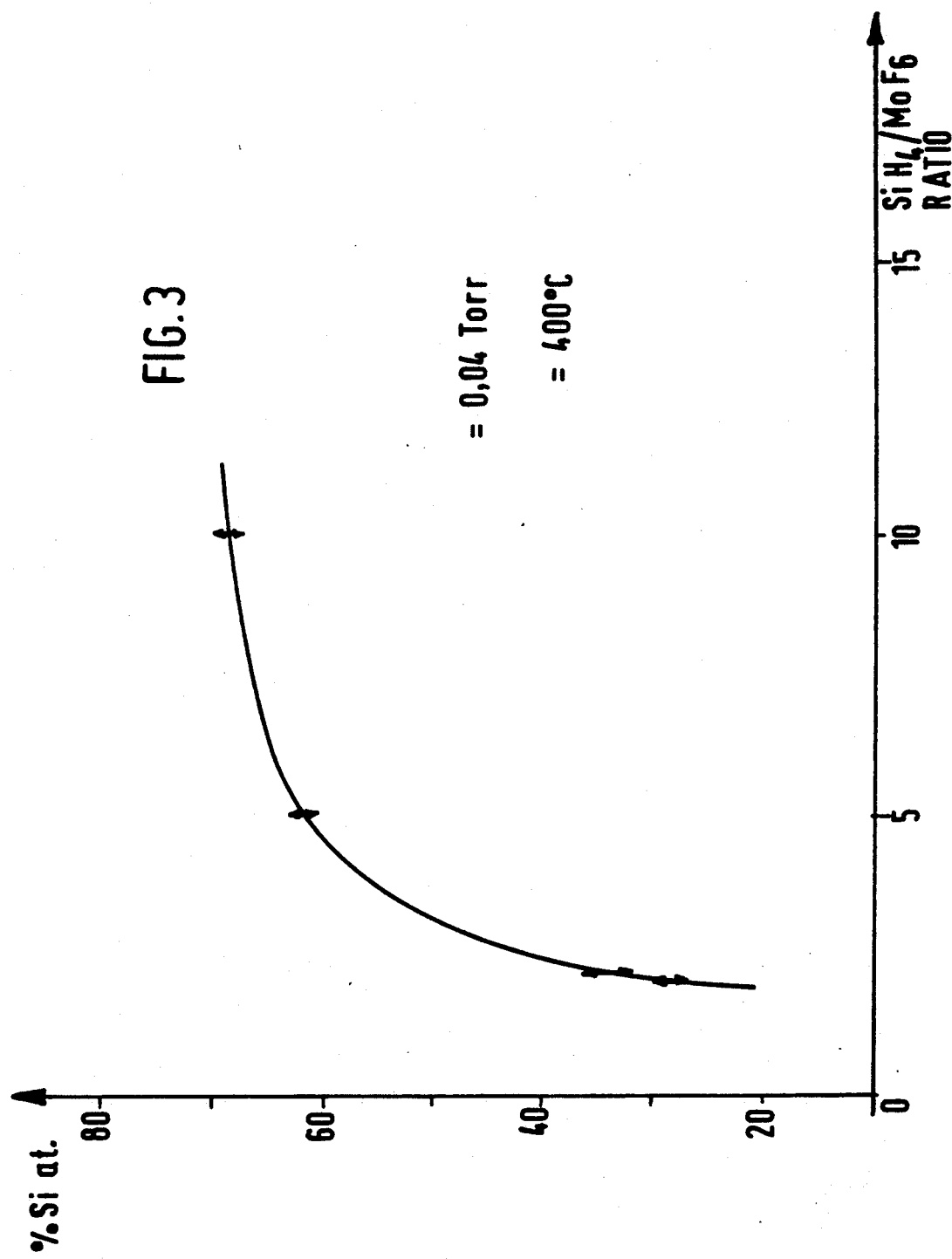

METHOD OF FORMING REFRACTORY METAL FREE STANDING SHAPES

BACKGROUND OF THE INVENTION

1. Field of the Invention

The present invention relates to a method of manufacturing free standing shapes of refractory metals and their silicides through a Chemical Vapor Deposition process, and particularly to a method of forming high quality refractory parts with high corrosion resistance.

2. Description of the prior art

Refractory metal parts are usually made through powder metallurgy processes. Die pressing and sintering of powders is a well established process route. More recently, injection moulding has extended the processing technology of metal powders to the production of more complex, near net shape components at density levels much higher than before. (For more details about this technology, it can be referred to the article of Robert W. MESSLER entitled "Powder injection moulding, research at Rensselear": an update Metal Powder Report, vol. 44, May 5, 1989-Pages 362-368, or to the article of P.J. JAMES entitled "Injection molding of metal powder", Metal Powder Report, vol. 44, May 5, 1989, pages 369-372).

However, although metal powder injection moulding is a potential and promising method, several problems and drawbacks remain. Such injection molding process requires large size sophisticated equipment, high investment cost and high production rates. The process itself is complicated (the debinding step requires a careful heating in a controlled atmosphere to optimize said step which makes it critical to achieve high quality products), time consuming (up to a few days for the overall process), energy consuming (sintering temperature is at least 1500° C. for refractory metals such as W, Mo or Ta). Finally, it is a poor yield process wherein shrinkage occurs during the sintering steps making it difficult to obtain tight dimensional tolerance without a post-machining step of workpiece.

In order to avoid those drawbacks, it has been recently suggested to use a chemical vapor deposition (CVD) process for small shaped and/or thin parts : it is suggested in "Advanced P.M. Materials at Fulmer Research" Metal Powder Report, Vol 44, Sep. 9, 1989 pages 607-611 to carry out Tungsten deposition on a support by reduction of Tungsten fluoride with hydrogen $H_2$ under CVD conditions. The same has also been suggested in Japanese patent application JP 63/286574 of SASAKI et al.

However, the use of refractory metal containing parts, either obtained by powder metallurgy or CVD routes, is limited under high temperature oxidizing environments under which oxidation of parts becomes then a real problem. In order to limit such phenomena, it is known to deposit and additional corrosion resistive layer typically refractory metal silicide such as $MoSi_2$, well-known for its anti-corrosion properties. Such additional layers are deposited by usual techniques such as pack cementation, slip pack or slurry methods. In this case, refractory metal parts withstanding to corrosive atmosphere are manufactured through a multi-step process.

SUMMARY OF THE INVENTION

The present invention aims at improving the elaboration of refractory metal parts by CVD processes. Another object of the present invention is to manufacture directly products through Chemical Vapor Deposition Process, such products having better resistivity to corrosion.

The present invention relates to a method of forming a free standing shape made of a material containing refractory metal comprising the steps of providing a mandrel in a CVD enclosure, injecting a refractory metal halide gas and a reducing gas in said enclosure, reacting said gases in said enclosure to generate a material containing refractory metal, growing a layer of said material containing refractory metal on said mandrel, then removing the mandrel to obtain said free standing shape, wherein the reducing gas is selected among the silicon hydride gases and their mixtures.

It has been unexpectedly found that, by using Silicon Hydride gases ($Si_nH_{2n+2}$) instead of hydrogen gas to reduce metal halides, free standing shapes of substantially pure refractory metals or/and highly corrosion resistant free standing shapes refractory metal silicides can be formed at low temperature, with high speed and high quality.

According to the invention, it is possible to make a piece of composition $MSi_z$, z being selected between about 0.01 and about 3. Z can be determined according to the reaction conditions in the CVD enclosure, and more precisely to the metal halides and silicon hydrides gases flowrates. When z is between about 0.01 and 0.1, the product is considered as a substantially pure refractory metal product, while when z is between about 0.1 and 3, the piece is a refractory silicide metal one, with corrosion resistance properties. In the latest case, such a product is more particularly adapted to be used under high temperature oxidizing environments.

Moreover, it is also possible according to the present invention, to vary at will the z value during the manufacture of these free standing shape parts, and thus to combine refractory and anti-corrosion properties. It is also within the scope of the present invention to prepare in the same enclosure and continuously a composite free standing shape part with high silicon content on one or both its surfaces (z>0.1) and with low silicon content in the bulk (z<0.1) confering to a substantially pure refractory metal part with corrosion resistance properties on one or both surfaces (or vice-versa in certain cases).

In order to obtain a refractory metal silicide $MSi_z$ (with z>0.1) offering corrosion protection, ti has been found that the ratio silicon hydride ($SiH_{2n+2}$)/metal halide ($MX_6$) must be chosen in the upper part of the selected range of flowrates according to the invention while substantially pure metal pieces can be obtained by decreasing the ratio silicon hydride ($Si_nH_{2n+2}$)/metal halide ($MX_6$).

By comparison, Sasaki et al does not teach nor suggest such corrosion resistant material while they only teach to use hydrogen gas.

The terms "mandrel" or "preform" are used throughout the specification and claims with the same meaning, i.e. support means having the desired shape on which the refractory metal containing layer is deposited and which can be further eliminated without substantially changing the integrity of the free standing shape.

The mandrel or preform used for deposition can be removed either by chemical or mechanical processes. In the case of chemical removal, the mandrel is chosen among metals easily dissolved in current acids, preferably copper and its alloys. In the case of mechanical removal, the mandrel is chosen among materials easily machinable such as Carbon.

Reaction temperature in the CVD enclosure is selected between about 20° C. and about 750° C.

Pressure is selected between 0.01 Torr (1,33 Pascal) and atmospheric pressure.

The metal halide gas are preferably fluoride gas or chloride gas, such as $WF_6$, $WC_{l6}$, $MoF_6$, $MoC_{l6}$, $TaF_5$, $TaC_{l5}$. The silicon hydride gas $Si_nH_{22n+2}$ (n=1, 2, 3...) is preferably $SiH_4$.

The ratio of flowrates of silicon hydride to metal halide is selected between about 0.2 and about 25.

In the case of $SiH_4$ and $WF_6$, the preferred conditions for the formation of the Tungsten pieces are as follows :

The ratio of flowrates $SiH_4/WF_6$ is between about 0.5 to about 0.8 to obtain almost pure Tungsten pieces.

The ratio of flowrates $SiH_4/WF_6$ is greater than 0.8 to obtain a silicide having corrosion protection properties.

Temperature deposition is between about 150° C. and about 750° C., preferably between about 300° C. and about 600° C.

In the case of $SiH_4$ and $MoF_6$, the preferable conditions for the formation of Molybdenum pieces are as follows :

The ratio of flowrates $SiH_4/MoF_6$ is between about 0.2 and about 2 to obtain almost pure Molybdenum pieces.

The ratio of flowrates SiH4 to MoF6 is between about 2 and about 25 in order to obtain a silicide for anticorrosion properties.

Temperature deposition is set between about 150° C. and about 750° C., preferably between about 300° C. and 600° C.

In addition to resistivity to corrosion, others advantages of the method disclosed herein are numerous, compared with the powder metallurgy process :

Thin refractory parts can be obtained at very low temperature in comparison with high temperature of sintering (at least 1500° C.) used in powder metallurgy process. Parts of some microns thick are easily obtainable according to the invention while the thickness lower limit for powder metallurgy is about 100 microns.

Considering that debinding and controlled atmosphere difficulties and long time processing problem are removed, cost becomes very attractive.

The problem of shrinkage, specific to the powder metallurgy processes, is avoided and the piece size can be adjusted exactly as a function of time deposition.

Another advantage of the invention over the prior art technique using $H_2$ is the lower deposition temperature (preferably down to 300° C.) for still high deposition rates.

In order to combine refractory and anti-corrosion properties, it is also in the scope of the present invention to form free standing shapes according to a continuous process comprising at least two steps the first step consists in the formation of an almost pure refractory metal piece allowing refractory property while the second step, consisting in the deposition of a refractory metal silicide layer, confers anti-corrosion properties to the part (or vice-versa in certain cases). For each step of the above process, it is within the scope of the present invention to vary at will the z value during the formation of the free-standing shape as explained herein before.

The applications of the present invention are preferably : thin wires and tubes, rings, refractory piping and especially piping for nuclear equipments, crucibles and preferably crucibles for physical evaporation, thin sheets for walls in hot furnace and for radiation shielding against X-Ray radiations, and in defense applications.

In order to improve the granular structure, substances in gaseous state at the reaction temperature can be added during the vapor growth. These substances are selected among hydrocarbons, saturated or not, substituted or not, and/or metallic carbonyl containing compounds $R_n(CO)_m$ wherein R is a metallic compound.

BRIEF DESCRIPTION OF THE DRAWINGS

FIG. 3 is a graph showing the relation between the Si amount in the deposited layer and the ratio $SiH_4/MoF_6$ for a specific CVD enclosure.

DESCRIPTION OF THE PREFERRED EMBODIMENT

Example 1

Figure 1:
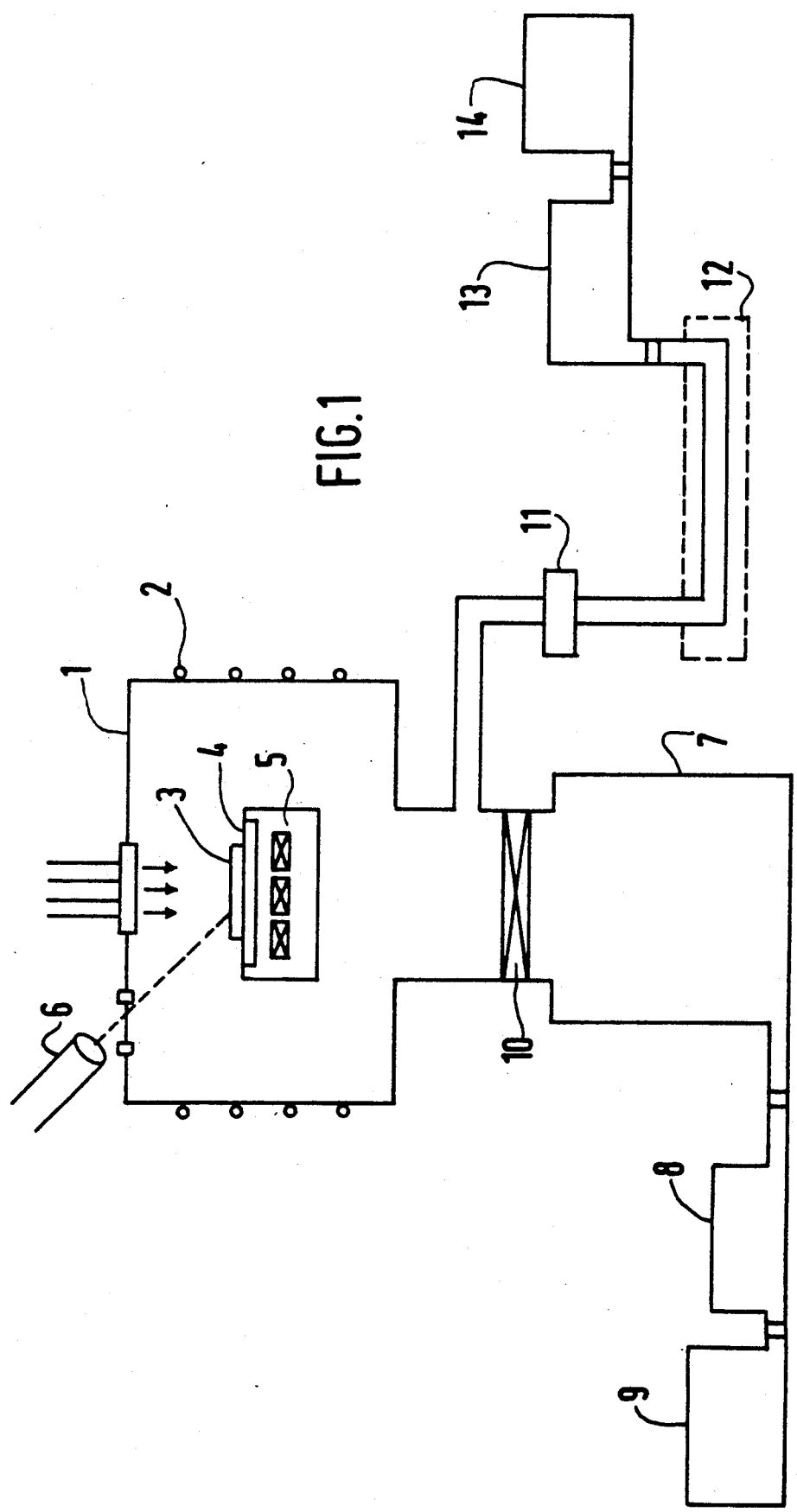
FIG. 1 is a CVD system used to carry out the present invention.

FIG. 1 is an example of CVD system which can be used for the present invention. It consists of a gas distribution system, a cold wall type chamber, a heating system, and a pumping system. The available gases are $SiH_4$, $WF_6$ (or $MoF_6$, $WC_{l6}$, $MoCL_6$, $TaF_5$, $TaCl_5$), He, and Ar.

Helium (He) is used as a carrier gas for metal halides. Argon is used to purge the chamber after the deposition is completed.

The chamber (1) is a cold wall type water cooled (2) reactor made in stainless steel. A copper mandrel (3), which has been forged under the shape of the desired piece, is set on a quartz plate (4) under which is a radiant heater (5) with three infrared lamps, positioned in the middle of the chamber.

The substrate temperature is measured by an infrared pyrometer (6). The chamber is pumped down by a turbomolecular pump (7), which is backed by one master booster pump (8) and a rotary pump (9). A pressure base around $10^{-6}$ Torr can be easily reached.

A gate valve (10) isolates the chamber from the turbomolecular pump. In addition a second pumping line bypassing the gate valve (11), a trap for detoxification (12), a master booster pump (13) and a rotary pump (14) is operated during deposition.

When the pressure base is reached, typically around $10^{-6}$ Torr, the pumping line is switched on that used for deposition.

In this example 1 here described, a Tungsten W crucible is made. After the stabilization of the substrate temperature, gases $SiH_4$, $WF_6$ and He are injected under the following flowrates :

| | |
|---|---|
| $SiH_4$ | 5 sccm |
| $WF_6$ | 10 sccm |
| He | 64 sccm |

The ratio $SiH_4/WF_6$ is 0.5. Deposition time is 2 hours. The pressure inside the chamber is set at 0.4 Torr and temperature is 500° C.

After the deposition is completed, several purges are carried out with Ar gas. Afterward, the Copper mandrel is dissolved in acids, and then characterization can be carried out.

A Scanning Electronic Microscope (SEM) analysis is carried out in order to determine the thickness of the piece which is free-standing. The measured thickness of the piece is 115 microns which have been obtained in 120 minutes, i.e. a deposition rate of about 1 micron/min.

Figure 2:
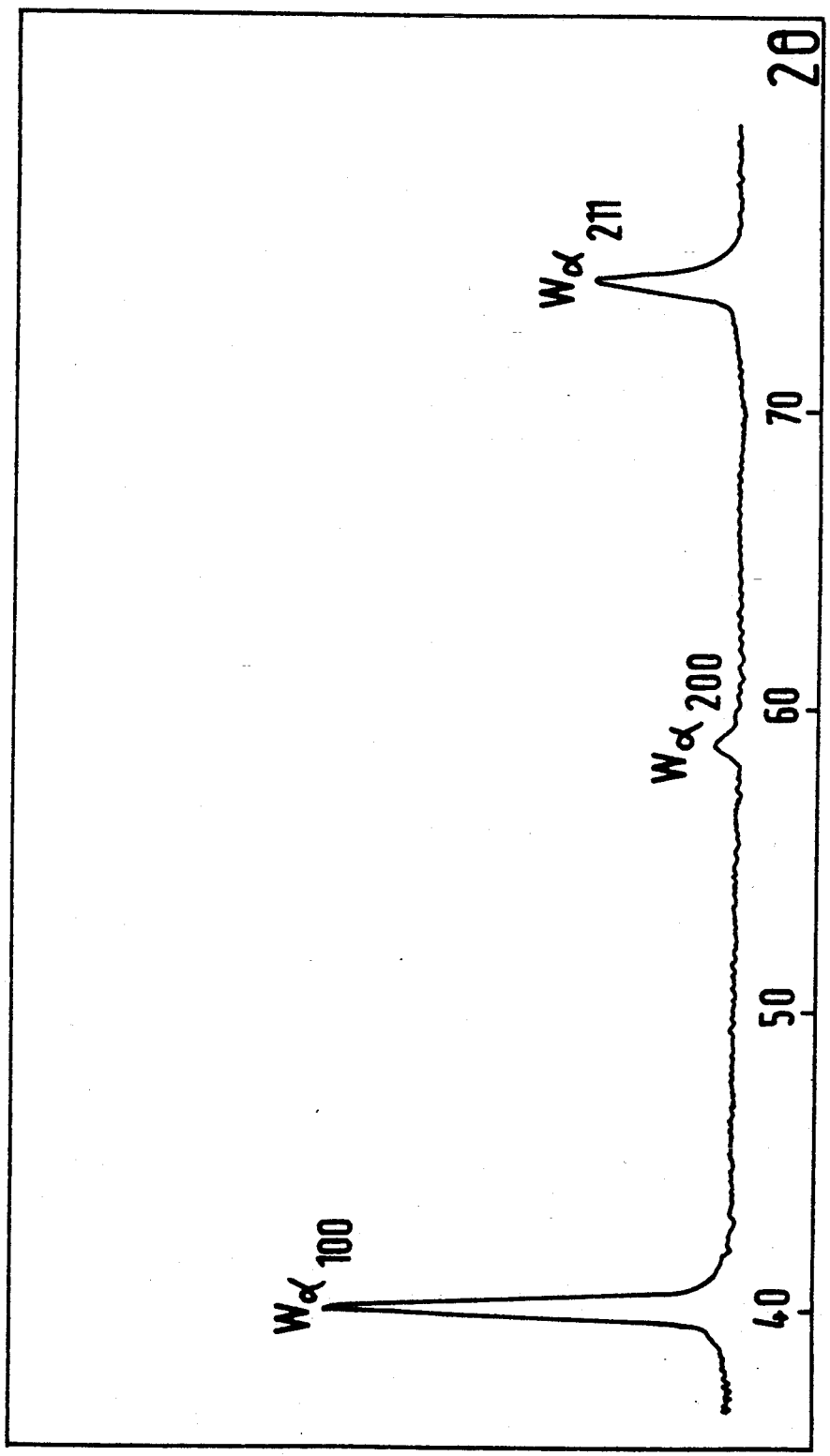
FIG. 2 is a graph showing X-Ray diffraction pattern for Tungsten sheets when Silicon amount is very low and considered as an impurity. Here, the ratio $SiH_4/WF_6=0.50$.

X-Ray diffraction results analysis, exemplified on FIG. 2, is carried out on the sample obtained under aforementioned conditions. This graph shows the three characteristic peaks of W Alpha phase. The presence of this Alpha phase indicates that those compounds have a crystalline structure.

Example 2

With the same conditions as those described in example 1, but with a deposition time of 15 minutes, a layer of 14 micron thick having the same composition is obtained.

Example 3

In this example, the flowrates ratio has been changed which determines the change of Si amount, while using the same reactor as in example 1, under the following conditions:

Various experiments have been done, using $SiH_4$ and $MoF_6$ as the reactant gases, and He as the carrier gas. For every experiment, a copper foil substrate is set in the reactor, then heated at 400° C. After temperature stabilization, gases are injected. Deposition time is 45 minutes. The pressure inside the chamber is set at 0.4 Torr.

Four identical experiments are done, with the following $SiH_4/MoF_6$ ratio: 2, 2.2, 5, 10. For each experiment, adjusting the pressure at 0.4 Torr is realized by controlling the He flowrate. After each experiment, a quantitative and qualitative analysis have been been carried out.

The results are shown on FIG. 3. From this graph, it becomes easy to choose the final properties of the part by selecting the right ratio for a desired amount of Si in the layer.

For example, after deposition with a ratio of 2.2, a quantitative and qualitative analysis is done, indicating the amount of Si in the formed sheet. In the same way as in example 1, SEM analysis is carried out. In this example, the measured thickness is 180 microns which means a deposition rate of about 4 microns/min.

Example 4

This example describes the way to obtain a Tungsten (W) containing sheet combining almost pure refractory metal and anti-corrosion properties, in a continuous process, in the same enclosure.

A first step consists in forming an almost pure Tungsten sheet with refractory properties. The second step consists in depositing a Tungsten silicide layer providing protection against corrosion. The apparatus is the same as in example 1. A Copper foil substrate is set in the reactor, and then heated at 400° C.

After the stabilization of the substrate temperature, the first step consists in injecting $SiH_4$, $WF_6$ and He under the following flowrates:

| | |
|---|---|
| $SiH_4$ | 6 sccm |

-continued

| | |
|---|---|
| $WF_6$ | 10 sccm |
| He | 64 sccm |

The ratio $SiH_4/WF_6$ is 0.60. Deposition time is 45 min. The pressure inside the chamber is set at 0.2. Torr and the temperature is about 300° C.

The second step consists in depositing a Tungsten silicide layer. The flowrates become:

| | |
|---|---|
| $SiH_4$ | 50 sccm |
| $WF_6$ | 10 sccm |
| He | 64 sccm |

The ratio $SiH_4/WF_6$ is 5, deposition time is 3 min, pressure inside the chamber remains at 0.2. Torr and temperature at 300° C.

Afterward, the Copper foil is dissolved in acids.

In this example, measured thickness at SEM is 65 microns about 60 microns for the almost pure Tungsten part, and about 5 microns for the protective Tungsten silicide layer. 65 microns are obtained in 48 min, which means a deposition rate of about 1.4. micron/min.

We claim:

1. A method of forming a free standing shape made of a material containing refractor metal, which comprises:
   a) providing a mandrel in a CVD enclosure,
   b) injecting a refractor metal halide gas selected from the group consisting of $WF_6$, $MoF_6$, $TaF_5$, $WCl_6$, $MoCl_6$ and $TaCl_5$ and mixtures thereof, and a reducing gas in said enclosure,
   c) reacting said gases in said CVD enclosure at a temperature of about 20° C. to about 750° C. during deposition, and at a pressure of about 1.33 Pascal to about atmospheric pressure,
   d) growing a layer of said material containing refractory metal on said mandrel, and then
   e) removing the mandrel to obtain the free standing shape, wherein the reducing gas is a silicon hydride gas selected from the group consisting of $SiH_4$, $Si_2H_6$ and $Sui_3H_8$ and mixtures thereof, and wherein a ratio of flow rates between the silicon hydride gas and the metal halide gas is between about 0.2 and about 25.

2. The method according to claim 1, wherein the mandrel is made of a material selected from the group consisting of metals and alloys thereof which are easily dissolved in acids.

3. The method according to claim 2, wherein the metal is selected from the group consisting of copper and alloys thereof.

4. The method according to claim 1, wherein the mandrel is made of an easily machinable material.

5. The method according to claim 4, wherein the mandrel is made of carbon.

6. The method according to claim 1, wherein the silicon hydride gas is silane gas ($SiH_4$) and the metal halide gas is $WF_6$ gas.

7. The method according to claim 6, wherein the ratio of flowrates of $SiH_4$ gas is comprised between about 0.5 and about 0.8 in order to obtain a substantially pure tungsten free standing shape metal silicide $MSi_z$ wherein $0.01 \leq z < 0.1$.

8. The method according to claim 6, wherein the ratio of flowrates of $SiH_4$ to $WF_6$ is comprised between about 0.8 and 25 in order to obtain a layer of WSiz wherein $0.1 < z \leq 3$ having anti-corrosion properties.

9. The method according to claim 6, wherein the temperature is comprised between about 300° C. and about 600° C.

10. The method according to claim 1, wherein the silicon hydride gas is $SiH_4$ and the metal halide gas is $MoF_6$ gas.

11. The method according to claim 10, wherein the ratio of flowrates of $SiH_4$ to $MoF_6$ is comprised between about 2 to 25.

12. The method according to claim 1, wherein further comprises two steps, a first step for the completion on the mandrel of a first layer of substantially pure refractory metal silicide MSiz with $0.01 \leq z \leq 0.1$, and a second step for the completion on said first layer of a second layer of metal silicide MSiz with $0.1 < z \leq 3$.

13. The method according to claim 1, wherein further comprises two steps, a first step for the completion on the mandrel of a first layer of metal silicide MSiz with $0.1 < z \leq 3$ and a second step for the completion on said first layer of a second layer of substantially pure refractor metal silicide MSiz with $0.01 \leq z \leq 0.1$.

14. The method according to claim 1, wherein at least one gaseous substance at the reaction temperature is simultaneously injected in the CVD enclosure with silicon hydride and metallic halide at least during a part of the injection of said gases.

15. The method according to claim 14, wherein said gaseous substance is selected from the group consisting of hydrocarbons of the formula $C_nH_m$ and metallic carbonyl compounds of the formula $R_n(CO)_m$.

* * * * *

UNITED STATES PATENT AND TRADEMARK OFFICE
CERTIFICATE OF CORRECTION

PATENT NO. :   5,230,847
DATED      :   July 27, 1993
INVENTOR(S) :  Pierre Jalby et al.

It is certified that error appears in the above-indentified patent and that said Letters Patent is hereby corrected as shown below:

On the title page, Item [73], should read: --L'Air Liquide, Societe Anonyme Pour l'Etude et l'Exploitation des Procedes Georges Claude, Paris Cedex, France--

Signed and Sealed this

Eighth Day of March, 1994

Attest:

BRUCE LEHMAN

*Attesting Officer*     *Commissioner of Patents and Trademarks*